(12) United States Patent
Lo

(10) Patent No.: US 8,921,132 B2
(45) Date of Patent: Dec. 30, 2014

(54) METHOD FOR MANUFACTURING LED PACKAGE

(71) Applicant: Advanced Optoelectronic Technology, Inc., Hsinchu Hsien (TW)

(72) Inventor: Hsing-Fen Lo, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/861,394

(22) Filed: Apr. 12, 2013

(65) Prior Publication Data

US 2013/0288407 A1 Oct. 31, 2013

(30) Foreign Application Priority Data

Apr. 25, 2012 (CN) .......................... 2012 1 0123657

(51) Int. Cl.
*H01L 33/52* (2010.01)
*H01L 33/00* (2010.01)

(52) U.S. Cl.
CPC ............ *H01L 33/52* (2013.01); *H01L 33/0095* (2013.01); *H01L 2933/0033* (2013.01)
USPC .......................................................... 438/27

(58) Field of Classification Search
None
See application file for complete search history.

(56) References Cited

U.S. PATENT DOCUMENTS

| | | | | |
|---|---|---|---|---|
| 5,840,614 A | * | 11/1998 | Sim et al. | 438/464 |
| 2001/0000079 A1 | * | 3/2001 | Usami et al. | 438/119 |
| 2004/0063840 A1 | * | 4/2004 | Starkey | 524/442 |
| 2005/0056854 A1 | | 3/2005 | Peh | |
| 2007/0189007 A1 | * | 8/2007 | Nishimoto et al. | 362/227 |
| 2007/0246715 A1 | * | 10/2007 | Shin et al. | 257/79 |
| 2008/0067534 A1 | * | 3/2008 | Hsieh et al. | 257/98 |
| 2008/0203897 A1 | * | 8/2008 | De Samber et al. | 313/498 |
| 2009/0114937 A1 | * | 5/2009 | Kawakubo | 257/98 |
| 2009/0242916 A1 | * | 10/2009 | Hsu et al. | 257/98 |
| 2010/0323924 A1 | * | 12/2010 | Li et al. | 506/33 |
| 2011/0210354 A1 | | 9/2011 | Ichikawa et al. | |
| 2012/0043576 A1 | * | 2/2012 | Hsieh et al. | 257/99 |

FOREIGN PATENT DOCUMENTS

| | | | |
|---|---|---|---|
| EP | 2273546 A1 | * | 1/2011 |
| JP | 2004-179644 A | | 6/2004 |
| TW | 201021252 A1 | | 6/2010 |
| TW | 201113958 A1 | | 4/2011 |
| TW | 201208147 A1 | | 2/2012 |

* cited by examiner

*Primary Examiner* — Charles Garber
*Assistant Examiner* — Alia Sabur
(74) *Attorney, Agent, or Firm* — Novak Druce Connolly Bove + Quigg LLP

(57) ABSTRACT

A method for manufacturing an LED package includes providing a substrate including an insulating layer inlayed with first and second electrodes. The first and second electrodes define a chip fastening area. An LED chip is fastened on the chip fastening area and electrically connected to the first and second electrodes. A buffer layer including a shelter and grooves is brought to be located over the substrate wherein the shelter covers the chip fastening area and the grooves are located over portions of the substrate beside the first and second electrodes. A reflecting layer is formed in the grooves of the buffer layer by injecting liquid material into the grooves. The buffer layer is removed after the liquid material is solidified and a through hole is defined. An encapsulant is formed to cover the LED chip by injecting the encapsulant into the through hole and the chip fastening area.

18 Claims, 8 Drawing Sheets

METHOD FOR MANUFACTURING LED PACKAGE

BACKGROUND

1. Technical Field

The present disclosure relates to methods for manufacturing light emitting devices, and more particularly, to a method for manufacturing an LED (light emitting diode) package, wherein the LED package can be manufactured more quickly and have a more reliable structure in electrical connection.

2. Description of Related Art

LEDs (Light-Emitting Diodes) have many advantages, such as high luminosity, low operational voltage, low power consumption, compatibility with integrated circuits, easy driving, long term reliability, and environmental friendliness. Such advantages have promoted the wide use of the LEDs as a light source. An LED package generally includes a substrate, a pair of electrodes formed in the substrate, a reflector mounted on the substrate, an LED chip mounted on the substrate, surrounded by the reflector and electrically connected to the pair of electrodes, and an encapsulant received in the reflector and sealing the LED chip. Generally, the substrate and the reflector are formed by insert molding technology, wherein the pair of electrodes is put in a mold firstly before injecting material for forming the substrate and the reflector into the mold. The LED chip is then mounted on the substrate and the encapsulant is then applied into the reflector. However, the mold used during the insert molding and the pair of electrodes are not completely smooth, whereby gaps may be formed between the mold and the electrodes. Thus, the plastic forming the reflector and substrate is easy to infiltrate into the gaps between the electrodes and the mold, thereby to form an insulating layer over the electrodes, which can cause a failed electrical connection between the LED chip and the electrodes in the following operation for electrically connecting the LED chip and the electrodes. In addition, the LED chips are put into the reflectors one by one, which is time consuming.

What is needed, therefore, is a method for manufacturing an LED package which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Referring to FIGS. 1-7, a method for manufacturing an LED package 100 (FIG. 8) in accordance with a first embodiment of the present disclosure is shown. The method mainly includes several steps as discussed below.

Figure 1:
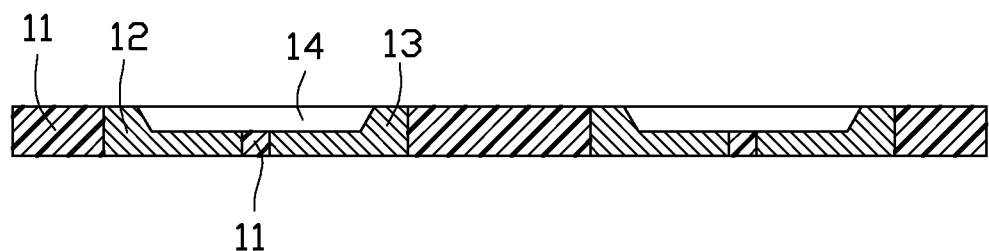
FIG. 1 shows a structure provided by a first step of a method for manufacturing an LED package in accordance with a first embodiment of the present disclosure.

Firstly, a substrate 10 is provided as shown in FIG. 1. The substrate 10 includes an insulating layer 11 inlayed with a plurality of pairs of first electrode 12 and second electrode 13. Each two adjacent pairs of first electrode 12 and second electrode 13 are separated and electrically insulated from each other by an interval part of the insulating layer 11. The first electrode 12 and the second electrode 13 of each pair are also separated and electrically insulated from each other by another interval part of the insulating layer 11. Each pair of first electrode 12 and second electrode 13 defines a concave chip fastening area 14. It is preferred that the another interval part of the insulating layer 11 between the first electrode 12 and the second electrode 13 of each pair is at a central position of the chip fastening area 14. The insulating layer 11 and the plurality of pairs of electrodes constitute a flat bottom surface and a top surface including the concave chip fastening areas 14. Portions of the insulating layer 11 between the first electrode 12 and the second electrode 13 are respectively located under the chip fastening areas 14 and are thinner than other portions of the insulating layer 11. It is preferred that a width of each chip fastening area 14 and a distance between each of two adjacent chip fastening areas 14 are equal. It is also preferred that chip fixing glue is set inside each chip fastening area 14; therefore LED chip 40 (see in FIG. 2) is easily fastened inside the chip fastening area 14.

Figure 2:
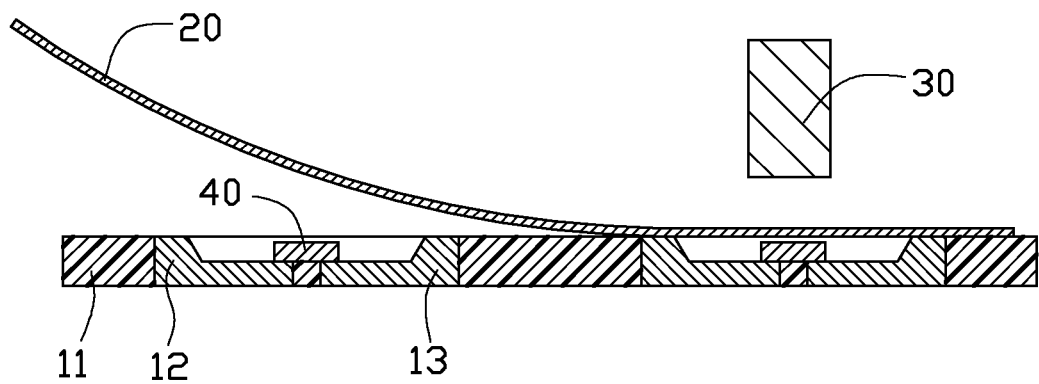
FIG. 2 shows a structure provided by a second step of the method for manufacturing the LED package in accordance with the first embodiment of the present disclosure.

As shown in FIG. 2, a blue film 20 with a plurality of LED chips 40 attached thereon is provided to cover the substrate 10. The plurality of LED chips 40 are adhered on a surface of the blue film 20 facing the substrate 10. Each LED chip 40 is corresponding to a chip fastening area 14 of the substrate 10. It is preferred that each LED chip 40 is corresponding to a center of each chip fastening area 14. The blue film 20 is irradiated with UV light (not shown) therefore glues between the blue film 20 and the LED chips 40 are cured and no longer adhesive whereby the LED chips 40 fall into the chip fastening areas 14. A laminating mold 30 is then provided to heat press the LED chips 40; therefore the LED chips 40 are firmly adhered inside the chip fastening areas 14. Due to the setting of chip fixing glue inside the chip fastening areas 14, the LED chips 40 are further firmly adhered inside the chip fastening areas 14. After pressing the LED chips 40, the blue film 20 and the laminating mold 30 are removed. It is understood that, during the heat pressing process, more than one laminating mold 30 can be provided and work together to heat press the LED chips 40; therefore, the step of heat pressing can be performed more efficiently. Thus, the step of fastening LED chips 40 is further simplified.

Figure 3:
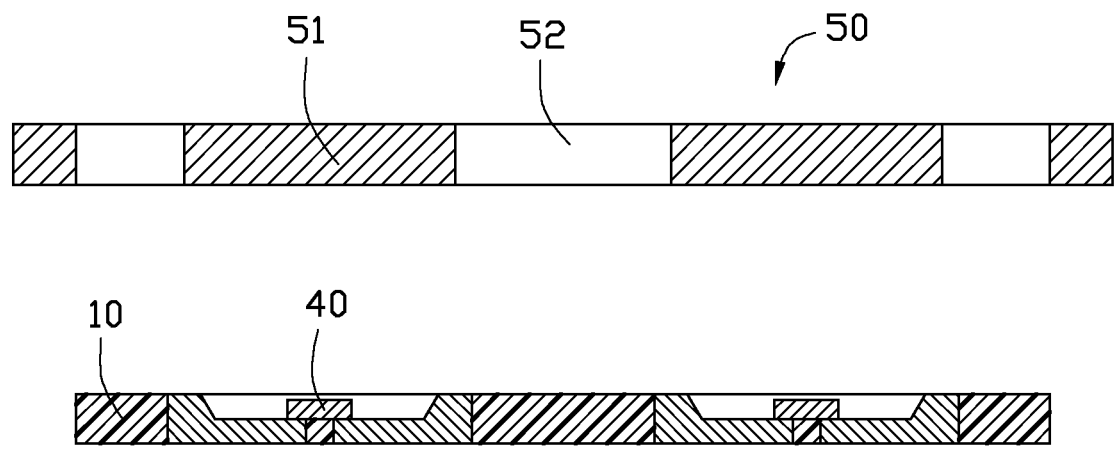
FIG. 3 shows a structure provided by a third step of the method for manufacturing the LED package in accordance with the first embodiment of the present disclosure.
Figure 4:
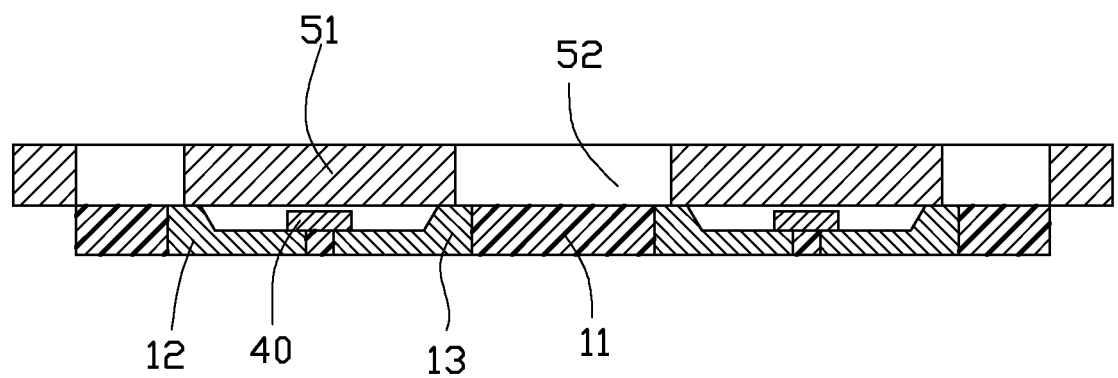
FIG. 4 shows a structure provided by a fourth step of the method for manufacturing the LED package in accordance with the first embodiment of the present disclosure.

As shown in FIGS. 3-4, a buffer layer 50 is provided to cover the substrate 10 mounted with LED chips 40. The buffer layer 50 is made of flexible materials such as polytetrafluoroethylene (PTFE). The buffer layer 50 includes a plurality shelters 51 corresponding to the chip fastening areas 14 and a plurality grooves 52 corresponding to the portions of insulating layer 11 between the pairs of first electrode 12 and second electrode 13. The grooves 52 each extend through the buffer layer 50, thereby communicating a top surface of the buffer layer 50 with a bottom surface of the buffer layer 50. A cross sectional area of the each groove 52 is larger than a cross sectional area of a corresponding portion of the insulating layer 11 between two adjacent pairs of first electrode 12 and second electrode 13. The interval parts of the insulating layer 11 between the pairs of first electrode 12 and second electrode 13 and peripheral portions of the first electrodes 12 and second electrodes 13 are exposed through the grooves 52 and all the chip fastening areas 14 are covered by the shelters 51.

Figure 5:
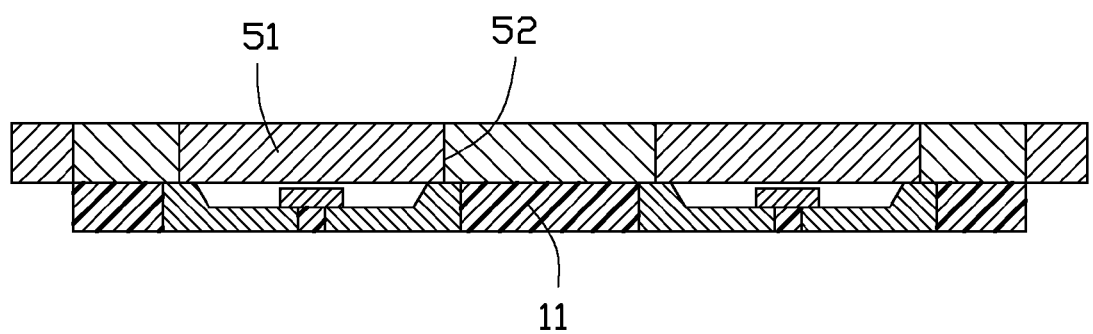
FIG. 5 shows a structure provided by a fifth step of the method for manufacturing the LED package in accordance with the first embodiment of the present disclosure.

As shown in FIG. 5, the grooves 52 are fully filled with liquid materials such as liquid epoxy resin, liquid silicone resin or other liquid polymer materials. A reflecting layer 60 is formed by the liquid materials described above after the liquid materials are solidified. Due to the buffer layer 50 being made of flexible materials, the shelters 51 and the corresponding first electrodes 12 and second electrodes 13 can closely engage with each other to eliminate any tiny gaps therebetween. Thus, the liquid materials will not permeate into the chip fastening areas 14 during injecting the liquid materials into the grooves 52 and the chip fastening areas 14 are kept clean of the liquid materials. In addition, because the reflecting layer 60 is formed after fastening the LED chips 40, even there is a little amount of the liquid materials which are for forming the reflecting layer 60 permeating into the chip fastening areas 14, the permeating liquid material will not affect the electrical connection between the LED chip 40 and the first electrode 12 and second electrode 13.

Figure 6:
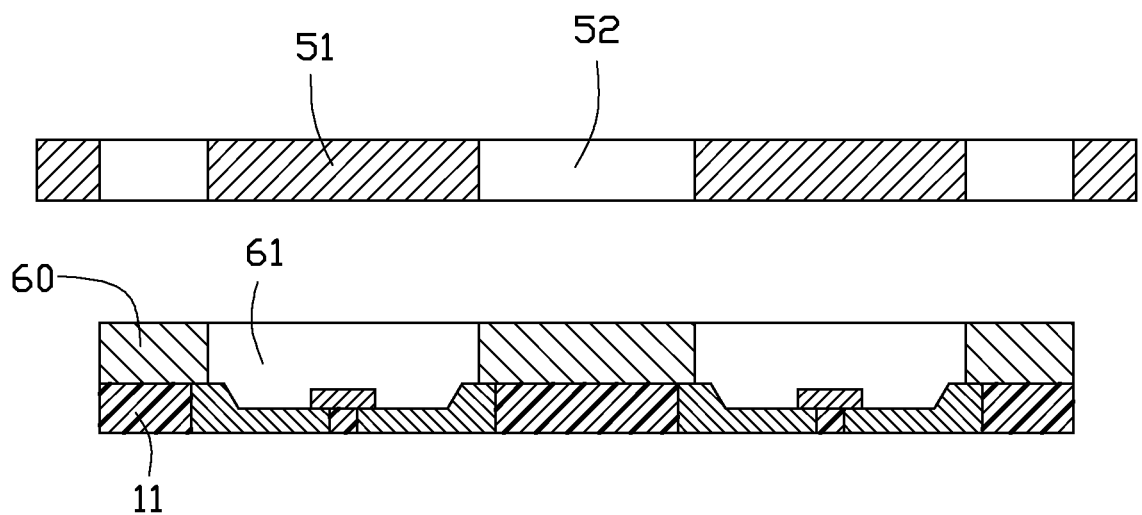
FIG. 6 shows a structure provided by a sixth step of the method for manufacturing the LED package in accordance with the first embodiment of the present disclosure.

As shown in FIG. 6, the buffer layer 50 is removed after the liquid materials are solidified to form the reflecting layer 60. The reflecting layer 60 covers the interval parts of the insulating layer 11 between the adjacent pairs of first electrode 12 and second electrode 13 and the peripheral portions of the first electrode 12 and the second electrode 13. A plurality of through holes 61 are defined in the reflecting layer 60. Each through hole 61 corresponds to and communicates with a chip fastening area 14.

Figure 7:
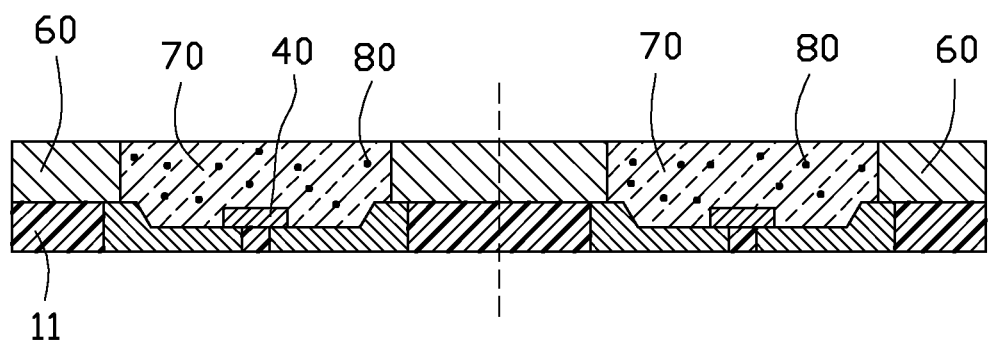
FIG. 7 shows a structure provided by a seventh step of the method for manufacturing the LED package in accordance with the first embodiment of the present disclosure.
Figure 8:
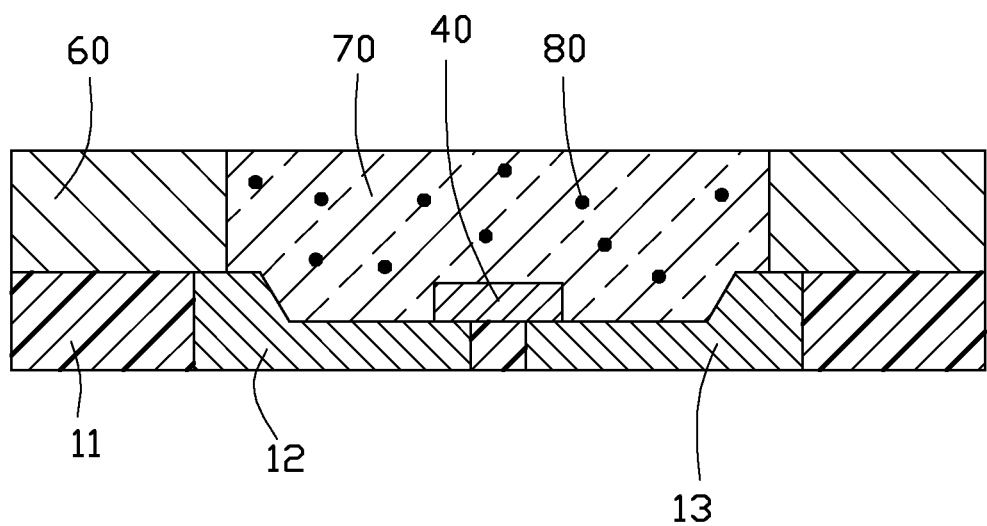
FIG. 8 shows a finished product of an LED package made by the method in accordance with the first embodiment of the present disclosure.

As shown in FIGS. 7-8, a plurality of encapsulants 70 are formed to fully fill the through hole 61 of the reflecting layer 60 and the chip fastening areas 14. The encapsulants 70 further include phosphors 80 contained therein. The phosphors 80 are uniformly distributed in the encapsulants 70. After the above steps, the semi-manufactured product is cut to obtain a plurality of completely manufactured LED packages 100. Each LED package 100 includes a pair of first electrode 12 and second electrode 13, and an insulating layer 11 which having a portion surrounding the pair of first electrode 12 and second electrode 13 and another portion separating the pair of first electrode 12 and second electrode 13, an LED chip 40 electrically connected to the first electrode 12 and second electrode 13, an encapsulating layer 70 with phosphor 80 covering the LED chip 40 and a reflecting cup 60 surrounding the encapsulating layer 70 and the LED chip 40.

Since the reflecting layer 60 is formed by injecting liquid materials to fill the grooves 52 of the buffer layer 50, a height of the reflecting layer 60 can be decided according to different demands by changing a thickness of the buffer layer 50 or changing an injected height of the liquid materials in the grooves 52. Thus, a thinner (low profile) LED package 100 can be obtained, compared with traditional LED packages.

It is understood that, the chip fastening areas 14 may be not concave but flattened with top surfaces thereof being coplanar with the top surface of the substrate 10. Therefore, the LED chips 40 protrude from the top surface of the substrate 10. Accordingly, figure of the buffer layer 50 is changed to include the shelters 51 which defines concavities in bottoms thereof for fittingly covering the LED chips 40. In that way, the chip fastening areas 14 are covered during formation of the reflecting layer 60 and liquid materials used to form the reflecting layer 60 is prevented from permeating into the chip fastening areas 14. Further, the LED chip 40 can be connected to the first electrode 12 and second electrode 13 via wire bonding.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A method for manufacturing LED (light emitting diode) packages, comprising:

providing a substrate comprising an insulating layer inlayed with a plurality of pairs of first electrode and second electrode, each pair of first electrode and second electrode defining a chip fastening area, a thickness of the first electrode and the second electrode being substantially the same as the thickness of the insulating layer, the insulating layer and the first electrode and the second electrode constituting a flat bottom surface and a top surface, the chip fastening area being concave from the top surface to the flat bottom surface of the first electrode and the second electrode;

fastening LED chips on the chip fastening areas of the substrate and electrically connecting the LED chips with corresponding first electrodes and second electrodes respectively;

providing a buffer layer comprising a plurality of shelters covering the chip fastening areas and a plurality of grooves exposing other portions of the substrate;

forming a reflecting layer in the grooves of the buffer layer by injecting liquid material into the grooves;

removing the buffer layer and a plurality of through holes being defined in the reflecting layer, each through hole being located over a corresponding chip fastening area;

forming a plurality of encapsulants in the through holes to cover the LED chips; and cutting the substrate to obtain completed LED packages each comprising a corresponding pair of first and second electrodes, a corresponding LED chip and a corresponding reflecting cup which is a part of the reflecting layer, the reflecting cup surrounding the corresponding LED chip.

2. The method of claim 1, wherein each two adjacent pairs of first electrode and second electrode are separated and electrically insulated from each other by an interval part of the insulating layer.

3. The method of claim 2, wherein the first electrode and the second electrode of each pair are separated and electrically insulated from each other by another interval part of the insulating layer.

4. The method of claim 3, wherein the another interval part of the insulating layer between the first electrode and the second electrode of each pair is at a central position of a corresponding chip fastening area.

5. The method of claim 4, wherein the another interval part of the insulating layer between the first electrode and the second electrode of each pair is thinner than the interval part of the insulating layer between each two adjacent pairs of first electrode and second electrode.

6. The method of claim 1, wherein a width of each chip fastening area is equal to a distance between each two adjacent chip fastening areas.

7. The method of claim 1, wherein the chip fastening areas have chip fixing glues set therein.

8. The method of claim 1, wherein the buffer layer is made of flexible materials.

9. The method of claim 1, wherein interval parts of the insulating layer between the pairs of first electrode and second electrode and peripheral portions of the first electrode and second electrode are exposed through the grooves, and all the chip fastening areas are covered by the shelters.

10. The method of claim 1, wherein the liquid material comprises liquid epoxy resin, liquid silicone resin or liquid polymer.

11. The method of claim 10, wherein the liquid material fully fills the grooves.

12. The method of claim 1, wherein the step of fastening LED chips on the chip fastening areas of the substrate comprises:
providing a film attached with the plurality of LED chips;
covering the substrate by the film with the LED chips located above and facing the chip fastening areas;
irradiating the film with ultraviolet light to separate the film and the LED chips, whereby the LED chips fall into the chip fastening areas; and
removing the film.

13. The method of claim 12, wherein before removing the film, a laminating mold is provided to heat press the LED chips and secure the LED chips in the chip fastening areas.

14. The method of claim 12, wherein the encapsulants comprise phosphors uniformly distributed therein.

15. A method for manufacturing an LED (light emitting diode) package, comprising:
providing a substrate comprising an insulating layer inlayed with a first electrode and a second electrode, the first electrode and second electrode defining a chip fastening area, a thickness of the first electrode and the second electrode being substantially the same as the thickness of the insulating layer, the insulating layer and the first electrode and the second electrode constituting a flat bottom surface and a top surface, the chip fastening area being concave from the top surface to the flat bottom surface of the first electrode and the second electrode;
fastening at least one LED chip on the chip fastening area of the substrate and electrically connecting the LED chip with the first electrode and second electrode;
providing a buffer layer over the substrate, wherein the buffer comprises a groove to expose the insulating layer around the first electrode and second electrode and a shelter covering the chip fastening area;
forming a reflecting layer in the groove of the buffer layer by injecting liquid material into the groove;
removing the buffer layer after the liquid material is solidified whereby a hole is defined in the reflecting layer by the removal of the buffer layer to expose the at least one LED chip; and
forming an encapsulant to encapsulate the at least one LED chip by applying the encapsulant into the hole and the chip fastening area.

16. The method of claim 15, wherein the first electrode and the second electrode are separated and electrically insulated from each other by an interval part of the insulating layer which is located between the first electrode and the second electrode and is at a central position of the chip fastening area.

17. The method of claim 15, wherein the step of fastening the at least one LED chip on the chip fastening area of the substrate further comprises:
providing a film attached with the at least one LED chip;
covering the substrate with the film wherein the at least one LED chip faces to the chip fastening area and is located above the chip fastening area;
irradiating the film with ultraviolet light to separate the film and the at least one LED chip, whereby the at least one LED chip falls into the chip fastening area; and
removing the film.

18. The method of claim 17, wherein before removing the film, a laminating mold is provided to heat press the at least one LED chip.

* * * * *